United States Patent [19]

Ikumi

[11] Patent Number: 5,619,674
[45] Date of Patent: Apr. 8, 1997

[54] MULTIPORT CACHE MEMORY HAVING READ-ONLY PARTS AND READ-WRITE PARTS

[75] Inventor: Nobuyuki Ikumi, Tokyo, Japan

[73] Assignee: Kabushiki Kaisha Toshiba, Kawasaki, Japan

[21] Appl. No.: 294,793

[22] Filed: Aug. 24, 1994

Related U.S. Application Data

[63] Continuation of Ser. No. 733,720, Jul. 22, 1991, abandoned.

[30] Foreign Application Priority Data

Jul. 27, 1990 [JP] Japan .................................. 2-197644

[51] Int. Cl.$^6$ .................................................. G01F 12/08
[52] U.S. Cl. ........................ 395/458; 395/431; 395/403; 395/476
[58] Field of Search ............................. 365/189, 189.05, 365/230.05; 395/400 MS, 425 MS, 458, 476, 403, 431

[56] References Cited

U.S. PATENT DOCUMENTS

| | | | |
|---|---|---|---|
| 4,768,172 | 8/1988 | Sasaki | 365/203 |
| 4,815,038 | 3/1989 | Scharrer et al. | 365/189 |
| 4,833,648 | 5/1989 | Scharrer et al. | 365/189.05 |
| 5,003,509 | 3/1991 | Bosnyak | 365/177 |
| 5,027,326 | 6/1991 | Jones | 365/189.05 |
| 5,062,081 | 10/1991 | Runaldue | 365/230.05 |
| 5,148,537 | 9/1992 | Belsan | 395/425 |
| 5,191,553 | 3/1993 | Mizoguchi et al. | 365/189.06 |
| 5,204,841 | 4/1993 | Chappell et al. | 365/230.05 |
| 5,313,551 | 5/1994 | Labrousse et al. | 395/425 |

FOREIGN PATENT DOCUMENTS

| | | |
|---|---|---|
| 0297571 | 4/1989 | European Pat. Off. . |
| 0340668 | 8/1989 | European Pat. Off. . |
| 0376253 | 4/1990 | European Pat. Off. . |

*Primary Examiner*—Reba I. Elmore
*Attorney, Agent, or Firm*—Foley & Lardner

[57] ABSTRACT

A multiport cache memory for exchanging data or instructions with a plurality of arithmetic circuitries independently according to a load instruction or a store instruction provided from a CPU. The cache memory comprises a plurality of read only ports for respectively transmitting data or instructions to each arithmetic circuit according to the load instruction, and a plurality of read/write ports for respectively transmitting the data or the instructions from to each arithmetic circuit according to the load or store instruction.

8 Claims, 4 Drawing Sheets

MULTIPORT CACHE MEMORY HAVING READ-ONLY PARTS AND READ-WRITE PARTS

This application is a continuation of application Ser. No. 07/733,720, filed Jul. 22, 1991 now abandoned.

BACKGROUND OF THE INVENTION

1. Field of the Invention

The present invention relates to a multiport cache memory in which two types of ports are provided for reducing the structure thereof.

2. Description of the Background Art

In general, as shown in FIG. 1, a conventional CPU 1 for accessing to a main memory 2 comprises:

an internal arithmetic circuitry 3; and a cache memory 4 for exchanging data or instructions with the main memory 2 at the low access speed of the main memory 2 and exchanging the data or the instructions with the arithmetic circuitry 3 at the high speed of the arithmetic circuitry 3. The main memory 2 is provided with large scale dynamic random access memory (DRAM).

In the above configuration, the arithmetic processing speed in the arithmetic circuitry 3 is not regulated by the low access speed in the main memory 2 because the arithmetic circuitry 3 exchanges the data or instructions with the cache memory 4.

However, even if the clock cycle is shortened, it is difficult to improve processing capacity other than by shortening the clock cycle because only one piece of data or one instruction can be executed in a clock cycle in the above conventional CPU.

Therefore, as shown in FIG. 2, another conventional CPU 5 for accessing to a main memory 2 comprises:

a plurality of internal arithmetic circuitries 3; and a cache memory 6 for exchanging data or instructions with the main memory 2 at the low access speed of the main memory 2 and exchanging data or the instructions with the arithmetic circuitries 3 at the high speed of the arithmetic circuitries 3.

In the above configuration, a plurality of data or instructions are processed in parallel.

Accordingly, processing capacity can be improved by means other than shortening the clock cycle because the plurality of data or instructions can be processed in parallel.

However, in the above configuration, it sometimes occurs that the plurality of internal arithmetic circuitries 3 simultaneously access the cache memory 6. In this case, if the cache memory 6 is provided with only one input/output port for the plurality of internal arithmetic circuitries 3, only one internal arithmetic circuitry 3 can access the cache memory 6, at a given time.

Therefore, arithmetic processing in most of the arithmetic circuitries 3, which can not access the cache memory 6, is stopped and processing capacity declines. Also, a complicated configuration is needed for determining the order of memory access from each arithmetic circuitry 3.

Therefore, if the cache memory 6 is changed to a multiport cache memory and each arithmetic circuitry 3 can independently access cache memory 6, the drawback in the conventional CPU 5 is solved and the advantage of the plurality of arithmetic circuitries 3 is demonstrated.

However, when the multiport cache memory is utilized with to the plurality of arithmetic circuitries 3, either a load instruction or a store instruction according to the arithmetic processing in the arithmetic circuitry 3 is provided to each port of the multiport cache memory. Therefore, in the ports of the multiport cache memory, both the load and store instructions must be processed respectively. That is, each port of the multiport cache memory comprises a read/write port in which read operation and write operation are capable.

Accordingly, when all of the ports in the multiport cache memory are configured as read/write ports, the number of wires connected to a memory cell 7 increases so that the area occupied by each port of the multiport cache memory increases as shown in FIG. 3.

Moreover, as shown in FIG. 3, data input/output operation between the memory cell 7 and the external circuitry is executed through a pair of bit lines. Therefore, doubling the number of bit lines so the likelihood increases of mutual interference between bit lines. As a result, the circuit design is complicated to prevent unstable access operation.

SUMMARY OF THE INVENTION

It is one object of the present invention to provide a multiport cache memory in which access operations of a plurality of arithmetic circuitries are simultaneously executed, the configuration is reduced and the reliability is improved.

The object is achieved by providing a multiport cache memory for exchanging data or instructions with a plurality of arithmetic circuitries independently according to a load instruction or a store instruction provided from a CPU, comprising:

a plurality of read only ports for respectively transmitting data or instructions to each arithmetic circuitry according to the load instruction; and a plurality of read/write ports for respectively transmitting data or instructions from/to each arithmetic circuitry according to the load or store instruction.

In above configuration, read only ports relate to only the load instruction, while read/write ports relate to both load and store instructions. Therefore, when a load instruction is provided from the CPU to the multiport cache memory, the data or instruction is transmitted from the multiport cache memory to the arithmetic circuitry through the read only port. On the other hand, when store instruction is provided from the CPU to multiport cache memory, the data or the instruction is transmitted from the arithmetic circuitry to the multiport cache memory through the read/write port.

Accordingly, the structure of the ports in the multiport cache memory can be reduced because the read only port is simpler than the read/write port.

It is preferable that the number of read only ports be more than the number of read/write ports according to the statistical ratio of load instructions to store instructions.

In the above configuration, the number of read only ports is determined according to the statistical ratio of load instructions to store instructions. Therefore, the size of the multiport cache memory according to the present invention is optimized to reduce the occupied area.

Accordingly, the multiport cache memory can efficiently be operated according to the load and store instructions provided from the CPU.

DESCRIPTION OF THE PREFERRED EMBODIMENT

The preferred embodiment of a multiport cache memory according to the present invention is described with reference to FIGS. 4, 5.

Figure 1:
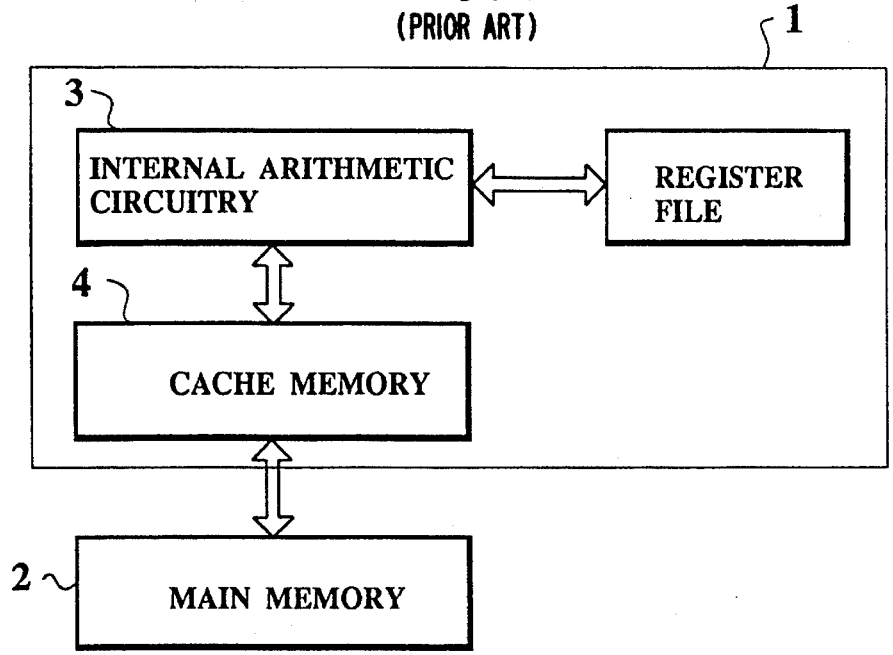
FIG. 1 is a block diagram of a conventional CPU being provided with a cache memory and an arithmetic circuitry.
Figure 2:
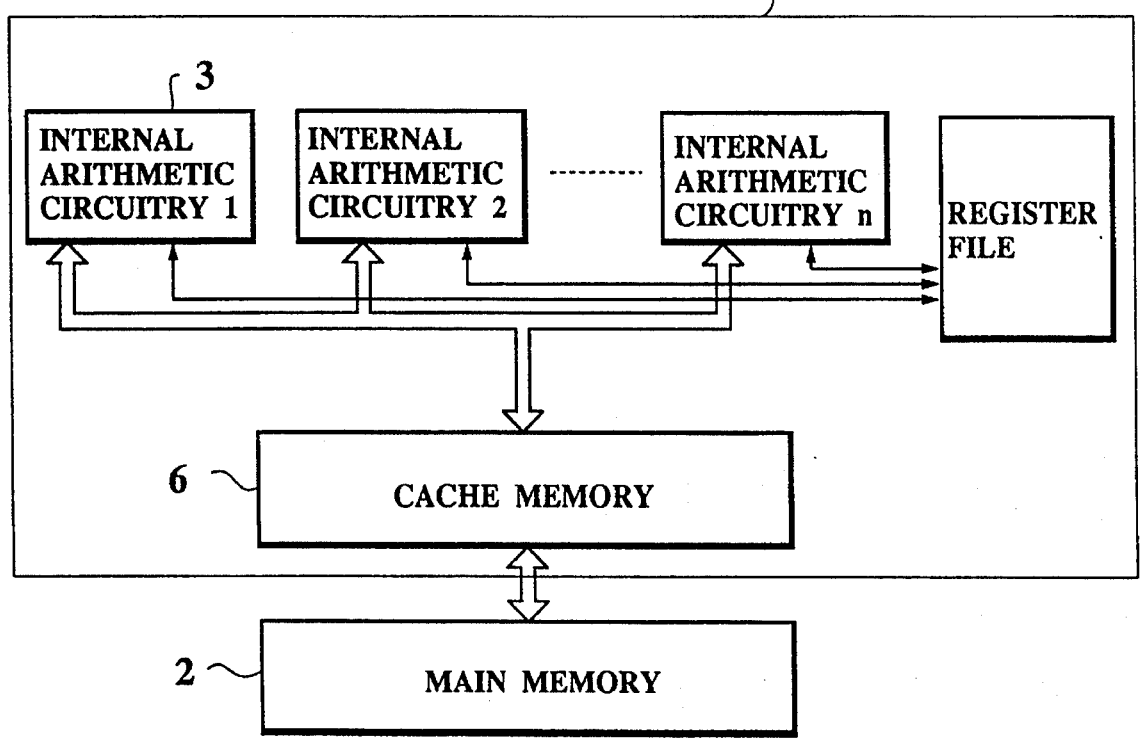
FIG. 2 is a block diagram of another conventional CPU being provided with a cache memory and a plurality of arithmetic circuitries.
Figure 3:
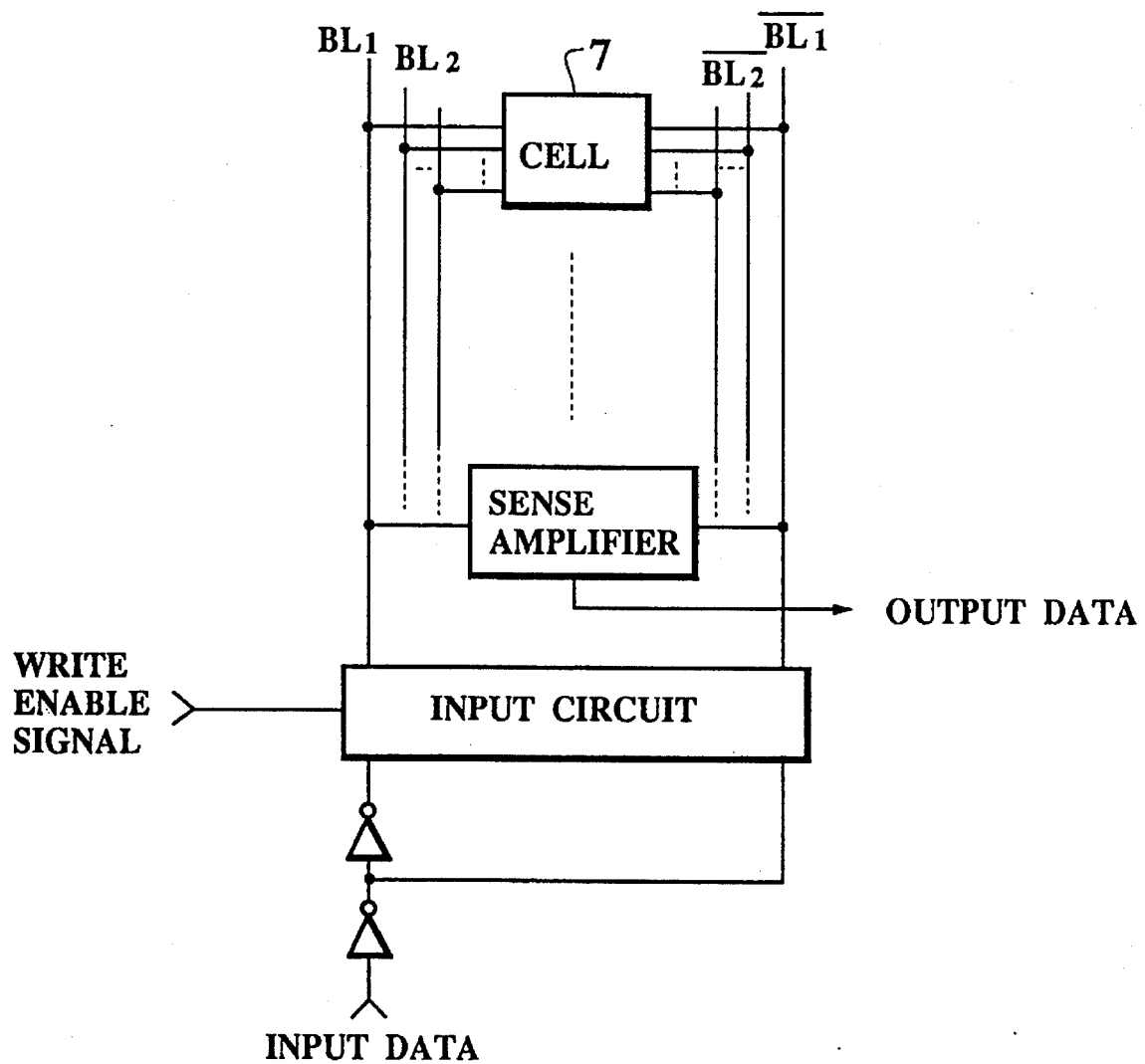
FIG. 3 is a schematic circuit of the port in the cache memory shown in FIGS. 1 and 2.
Figure 4:
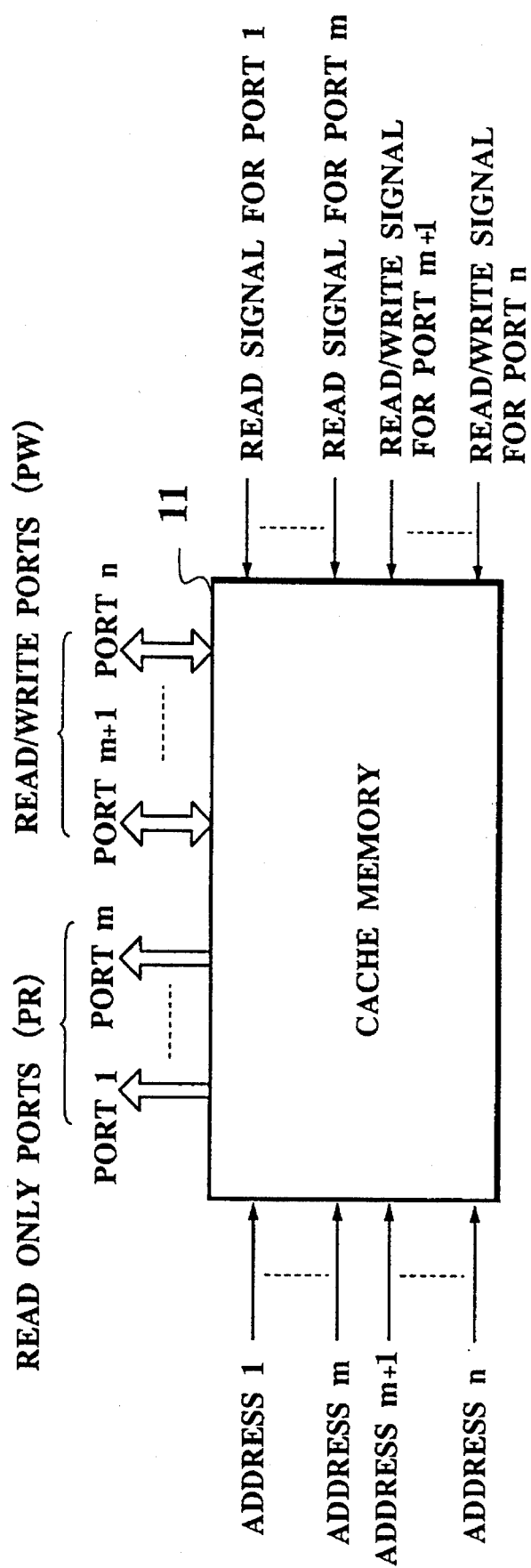
FIG. 4 is a schematic view of a multiport cache memory according to the present invention for showing the operation in the memory.

FIG. 4 is a schematic view of a multiport cache memory according to the present invention for showing the operation in the memory.

As shown in FIG. 4, the multiport cache memory 11 for exchanging data or instructions with a plurality of arithmetic circuitries (not shown) independently according to a load instruction or a store instruction provided from the CPU (not shown), comprises:

read only ports PR for respectively transmitting the data or the instructions to each arithmetic circuitry according to the load instruction, the ports PR being m (m<n) in number; and read/write ports PW for respectively transmitting the data or the instructions from/to each arithmetic circuitry according to the load or store instruction, the ports PW being n–m in number.

In the above configuration, the read only port PR is provided the load instruction from the CPU so that the data or the instruction is transmitted from the multiport cache memory 11 to the corresponding arithmetic circuitry under the control of the load instruction. On the other hand, the read/write port PW is provided the load and store instructions from the CPU so that the data or the instruction is transmitted in the same manner as in the read only port PR when the CPU provides the load instruction to the cache memory, while the data or the instruction is transmitted to the multiport cache memory 11 from the corresponding arithmetic circuitry under the control of the store instruction.

In the preferred embodiment, the number of read only ports PR is more than the number of read/write ports PW. That is, m>n–m. The reason is as follows.

Based on statistical analysis, number of load instructions is typically more than the number of store instructions.

Accordingly, because all of the ports in the multiport cache memory comprise read/write ports PW (n–m in number) and a greater number of read only ports PR (m in number), a plurality of accesses required from the CPU can simultaneously be executed though there are fewer write ports.

Next, the operation in the multiport cache memory 11 is described in detail with reference to FIG. 5.

Figure 5:
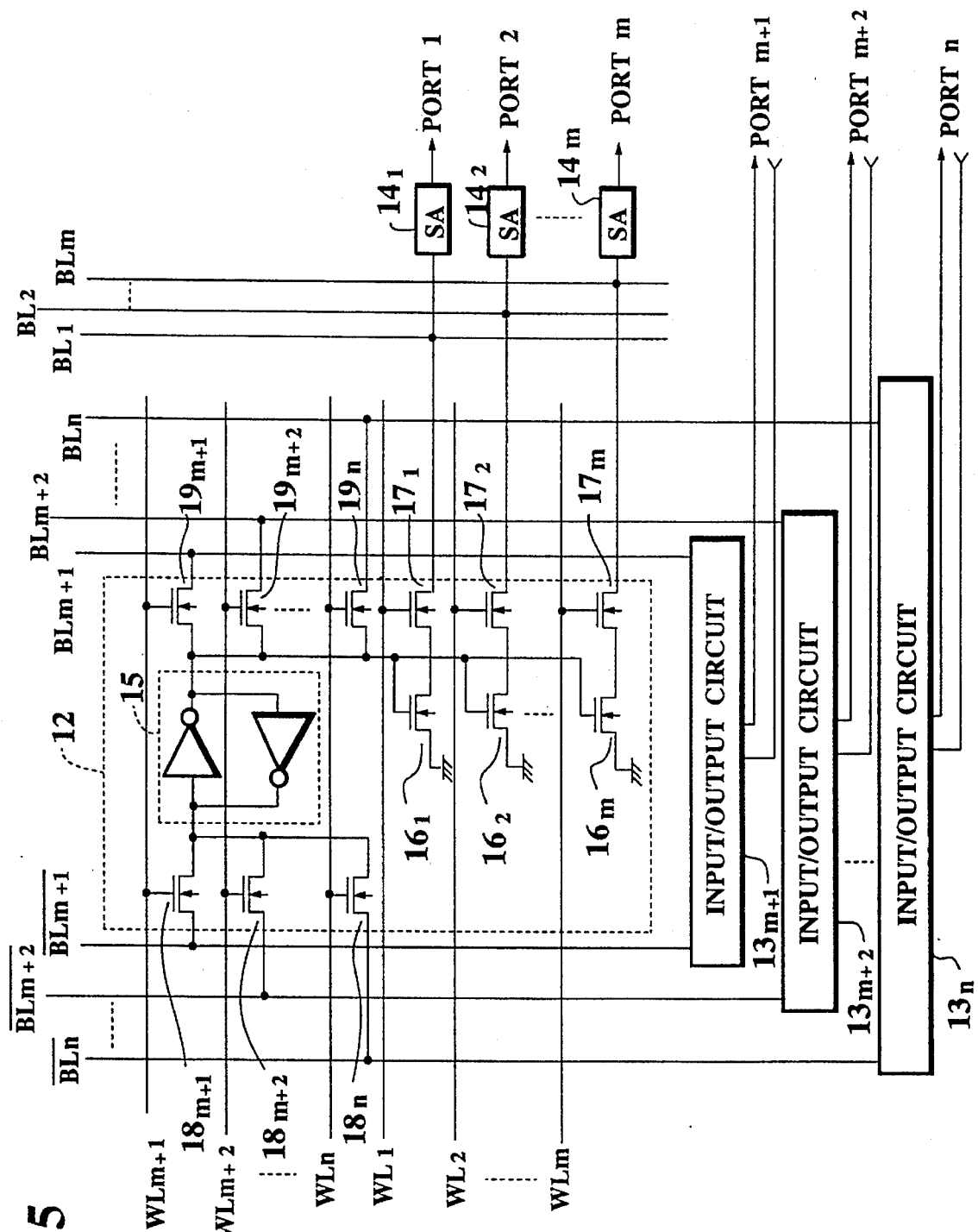
FIG. 5 is a schematic circuit of the ports in the multiport cache memory shown in FIG. 4.

FIG. 5 is a schematic circuit of the ports in the multiport cache memory shown in FIG. 4.

As shown in FIG. 5, the multiport cache memory 11 comprises:

a plurality of memory cells 12, one bit of the data or the instruction being stored in each memory cell 12;

input/output circuits 13 (n–m in number), each circuit 13 corresponding to the read/write port PW;

a plurality of paired bit lines BL, $\overline{BL}$ for respectively transmitting the data or the instruction between the memory cell 12 and the input/output circuit 13, the bit lines BL, $\overline{BL}$ being n–m pairs and each pair of bit lines BL, $\overline{BL}$ being connected to each memory cell 12 in parallel;

a plurality of sense amplifiers (SA) 14 (m in number) for respectively amplifying the data signal or the instruction signal being read from the designated memory cell 12, each SA 14 corresponding to the read only port PR; and a plurality of bit lines BL (m in number) for respectively transmitting the data or the instruction from the designated memory cell 12 to the corresponding read only ports PR through the corresponding SA 14, and each bit lines BL being connected to each memory cell 12 in parallel.

The memory cell 12 comprises:

a latch circuit 15 for storing one bit of data or instruction, the circuit 15 including two inverters whose input terminals are respectively connected to the other's output terminal;

a plurality of field effect transistors (FET) 16 (m in number) which turn on when a one bit signal stored in the latch circuit 15 is provided to the gate thereof;

a plurality of FETs 17 for transmitting the one bit signal to a corresponding read only port PR through a corresponding bit line BL when the FET 17 receives a word signal from a corresponding word line WL to the gate thereof; and a plurality of paired transfer gates 18, 19 (n–m pairs in number) for controlling a one bit signal passing between the latch circuit 15 and a corresponding pair of bit lines BL, $\overline{BL}$, the gates 18, 19 turning on when a word signal provided from a corresponding word line WL is provided to the gates thereof.

In the above configuration, when an access requirement is provided from the CPU to a certain read only port PR, a one bit signal stored in a specific latch circuit 15 which is designated by the CPU is read out to the read only port PR through a FET 16, a FET 17, a bit line BL, and an SA 14. In this case, the FET 17 is turned on by the corresponding word signal which is provided to the word line under the control of the CPU.

When an access requirement is provided from the CPU to a certain read/write port PW to read out one bit paired signals stored in a specific latch circuit 15 which is designated by the CPU, the signals are read out in parallel to the read/write port PW through a pair of transfer gates 18, 19, a pair of bit lines BL, $\overline{BL}$, and an input/output circuit 13. In this case, the paired transfer gates 18, 19 are turned on by the corresponding word signals which are provided to the word lines under the control of the CPU.

When an access requirement is provided from the CPU to a certain read/write port PW to store a one bit signal to a certain latch circuit 15, the signal is transmitted to the latch circuit 15 through an input/output circuit 13, a pair of bit lines BL, $\overline{BL}$, and a pair of transfer gates 18, 19. In this case, the paired transfer gates 18, 19 are turned on by the corresponding word signals which are provided to the word lines under the control of the CPU.

Therefore, as shown in FIG. 5, the number of paired bit lines BL, $\overline{BL}$ is twice the number of bit lines BL. Also, to read or write a one bit signal through the read/write port PW, the input/output circuits 13 are necessary. The increase of the structure is more remarkable as the memory capacity is increased. In other words, if all of the ports are read/write ports PW, the multiport cache memory is too large to process the data or the instruction.

Accordingly, because most of the ports are read only ports in this embodiment, the occupied area can dramatically be reduced in the integrated circuit as compared with the conventional multiport cache memory in which all of the ports are read/write ports PW.

Also, in the read only port PR, one bit data read from the latch circuit 15 is provided to the gate of the FET 16, then the electric potential of the bit line connected to the SA 14 is changed according to the condition of the FET 16 which is turned on or off under the control of the CPU. The electric potential transmitted to the SA 14 is amplified so that the one bit data is read out. Therefore, the stored data is not affected by the other data stored in the other latch circuits. In other words, the reading operation is stably executed.

On the other hand, when one bit data stored in the latch circuit 15 is read out to the outside through the read/write port PW, the data is read out to the paired bit lines BL, $\overline{BL}$ through the transfer gates 18, 19. Therefore, the data of the other latch circuits or the surrounding noise is isolated from the latch circuit 15 through the paired bit lines BL, $\overline{BL}$ so that the proper data is deleted.

Therefore, to prevent the above influence in the conventional multiport cache memory, the circuitry including the latch circuit in the memory cell, the transfer gates, the loaded transistors of the bit lines, and the like must be optimized to stabilize the reading operation.

However, in the present invention, because the number of the read only ports PR is more than the number of the read/write ports PW, the stability of the reading operation can be improved and the complexity of the circuit design can be avoided.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A multiport cache memory composed of a static random access memory which includes a plurality of field effect transistors, comprising:

a plurality of latch circuits each for storing a bit of information;

a plurality of read/write ports for selectively accessing said plurality of latch circuits, each one of said plurality of read/write ports being available for either of a read operation from said multiport cache memory and a write operation to said multiport cache memory;

a plurality of read only ports for selectively accessing said plurality of latch circuits, each of said plurality of read only ports being available only for the read operation from said multiport cache memory; and a plurality of bit lines and word lines, through which said plurality of read/write ports and said plurality of read only ports access said plurality of latch circuits, wherein a hardware amount of each of said read only ports is reduced as compared to a hardware amount of each of said read/write ports due each of said read only ports being available only for the read operation.

2. The multiport cache memory as claimed in claim 1 wherein a number of said plurality of read/write ports is less than the number of said read only ports.

3. The multiport cache memory as claimed in claim 1 wherein each of said plurality of bit lines connected to said plurality of read only ports is connected to a common voltage level through a first Field Effect Transistor (FET) and a second FET connected in series, said first FET having a gate terminal connected to one of said plurality of latch circuits, said second FET having a gate terminal connected to one of said plurality of word lines.

4. The multiport cache memory as claimed in claim 1 wherein said multiport cache/memory is connected between a main memory and a plurality of internal arithmetic circuits.

5. A multiport cache memory composed of a static random access memory which includes a plurality of field effect transistors, said static random access memory connected between a main memory and a plurality of internal arithmetic circuits which can access said main memory independent of each other, said multiport cache memory comprising:

a plurality of latch circuits each storing a bit of information;

a plurality of read/write ports for selectively accessing said plurality of latch circuits through bit lines and word lines provided for said plurality of read/write ports, each of said plurality of read/write ports being available for either one of a read operation from said multiport cache memory and a write operation to said multiport cache memory; and a plurality of read only ports for selectively accessing said plurality of latch circuits through bit lines and word lines provided for said plurality of read only ports, each of said plurality of read only ports being available only for the read operation from said multiport cache memory, wherein a number of said plurality of read only ports in said multiport cache memory is a greater number than a number of said plurality of read/write ports in said multiport cache memory, and wherein a hardware amount of each of said read only ports is reduced as compared to a hardware amount of each of said read/write ports due to each of said read only ports being available only for the read operation.

6. A multiport cache memory composed of a static random access memory which includes a plurality of field effect transistors, comprising:

a plurality of latch circuits each for storing a bit of information;

n read/write ports for selectively accessing said plurality of latch circuits, n being an integer greater than one, each one of said n read/write ports being configured within said multiport cache memory for either of a read operation from said multiport cache memory and a write operation to said multiport cache memory;

m read only ports for selectively accessing said plurality of latch circuits m being an integer greater than n, each of said m read only ports being configured within said multiport cache memory only for the read operation from said multiport cache memory;

a plurality of bit lines and word lines, through which said n read/write ports and said m read only ports access said plurality of latch circuits;

n input/output circuits coupled on a one-to-one basis to said n read/write ports, each of said n input/output circuits providing for one of output of data from said static random access memory and input of data to said static random access memory via said corresponding one of said n read/write ports; and m output only circuits coupled on a one-to-one basis to said m read only ports, each of said m output only circuits providing for only output of data from said static random access memory via said corresponding one of said m read only ports.

7. The multiport cache memory as claimed in claim 6, wherein a hardware amount of any one of said n input/output circuits is greater than a hardware amount of any one of said m output only circuits.

8. The multiport cache memory as claimed in claim 7, wherein each of said n input/output circuits are responsive to a read instruction so as to output data stored within said multiport cache memory to a location external to the multiport cache memory, wherein each of said n input/output circuits are responsive to a write instruction so as to input data to said multiport cache memory from the location external to the multiport cache memory, wherein each of said m output only circuits are responsive to the read instruction so as to output data stored within said multiport cache memory to the location external to the multiport cache memory, and wherein each of said m output only circuits are not responsive to the write instruction.

* * * * *